(12) United States Patent
Kim et al.

(10) Patent No.: US 8,003,464 B2
(45) Date of Patent: Aug. 23, 2011

(54) METHODS OF MANUFACTURING SEMICONDUCTOR DEVICE HAVING RECESS CHANNEL ARRAY TRANSISTOR

(75) Inventors: Gil-sub Kim, Daegu (KR); Yong-il Kim, Hwaseong-si (KR); Jong-seop Lee, Osan-si (KR); Jai-kyun Park, Hwaseong-si (KR); Yun-sung Lee, Seongnam-si (KR); Nam-jung Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 425 days.

(21) Appl. No.: 12/213,230

(22) Filed: Jun. 17, 2008

(65) Prior Publication Data

US 2009/0203204 A1 Aug. 13, 2009

(30) Foreign Application Priority Data

Feb. 13, 2008 (KR) ........................ 10-2008-0013010

(51) Int. Cl.
*H01L 21/336* (2006.01)

(52) U.S. Cl. .. 438/268; 438/270; 438/692; 257/E29.201

(58) Field of Classification Search .......... 438/268–274, 438/690–705; 257/E29.201
See application file for complete search history.

(56) References Cited

U.S. PATENT DOCUMENTS

| 5,960,300 A * | 9/1999 | Yabu et al. ..................... 438/436 |
| 7,183,600 B2 * | 2/2007 | Kim et al. ..................... 257/295 |
| 2007/0082440 A1 * | 4/2007 | Shiratake ..................... 438/243 |
| 2007/0117294 A1 * | 5/2007 | Kim ............................. 438/197 |

FOREIGN PATENT DOCUMENTS

| JP | 2007-123551 | 5/2007 |
| KR | 1020050112790 | 12/2005 |
| KR | 1020070017593 | 2/2007 |

* cited by examiner

*Primary Examiner* — H. Jey Tsai
(74) *Attorney, Agent, or Firm* — Harness, Dickey & Pierce, P.L.C.

(57) ABSTRACT

Methods of manufacturing a semiconductor device having an RCAT are provided. The method includes forming a first recess having a first depth formed in an active region of a semiconductor substrate, and a second recess having a second depth that is less than the first depth formed in an isolation layer. The depth of the second recess is decreased by removing the isolation layer from the upper surface of the isolation layer by a desired thickness. A gate dielectric layer is formed on an inner wall of the first recess and a gate is formed on the gate dielectric layer.

21 Claims, 7 Drawing Sheets

METHODS OF MANUFACTURING SEMICONDUCTOR DEVICE HAVING RECESS CHANNEL ARRAY TRANSISTOR

PRIORITY STATEMENT

This application claims the benefit of the priority under 35 U.S.C. §119 from Korean Patent Application No. 10-2008-0013010, filed on Feb. 13, 2008, in the Korean Intellectual Property Office, the disclosure of which is incorporated herein in its entirety by reference.

BACKGROUND

1. Field

Example embodiments relate to methods of manufacturing a semiconductor device. Other example embodiments relate to methods of manufacturing a semiconductor device having a recess channel array transistor (RCAT).

2. Description of the Related Art

As semiconductor memory devices become more highly integrated, memory cells gradually become smaller. As such, a variety of efforts have been made to form a memory device having a desired cell capacitance and/or to increase a cell transistor characteristic in smaller memory cells. As the size of the memory cell decreases, a cell transistor having a smaller size may be needed. To implement a cell transistor having desired characteristics in spite of the miniaturization of the memory cell, a method of controlling the concentration of impurities in a diffusion layer has been researched. As the length of a channel decreases, controlling the depth of the diffusion layer of a transistor becomes increasingly difficult in a variety of thermal treatment processes during a device manufacturing process. As an effective channel length and/or a threshold voltage decrease, a short channel effect occurs. The short channel effect causes problems in the operation of the cell transistor.

To address the above problem, a recess channel array transistor (RCAT), in which a recess is formed on a surface of a substrate and a gate of a transistor is formed in the recess, is being researched. In the RCAT, because the gate is formed in the recess formed in the substrate, the distance between a source and a drain is extended such that the effective channel length increases and the short channel effect decreases.

To manufacture the RCAT, an isolation layer for limiting an active region may be formed on a semiconductor substrate. A recess for forming a gate electrode in the active region of the semiconductor substrate may be formed. An unwanted recess may be form in the isolation layer if the recess is formed in the active region. If a conductive material for a gate is deposited in the recess formed in the active region, the conductive material may also be deposited in the recess that is formed in the isolation layer. As such, if the gate formed in the isolation layer is operated, the gate formed in the recess is affected such that noise is generated. The noise deteriorates refresh characteristics of the gate formed in the active region.

SUMMARY

Example embodiments relate to methods of manufacturing a semiconductor device. Other example embodiments relate to methods of manufacturing a semiconductor device having a recess channel array transistor (RCAT).

Example embodiments provide methods of manufacturing a semiconductor device which may increase a refresh characteristic of an RCAT by removing (eliminating) the source of noise generation, which may have an undesirable influence on a gate formed in a recess of the active region during formation of a small RCAT that is used in a more highly integrated semiconductor device.

According to example embodiments, a method of manufacturing a semiconductor device includes defining an active region by forming an isolation layer in a semiconductor substrate, forming a plurality of recesses including a first recess formed in the active region to a first depth and a second recess formed in the isolation layer to a second depth that is less than a first depth, decreasing the depth of the second recess by removing the isolation layer from the upper surface of the isolation layer by a first thickness, forming a gate dielectric layer on an inner wall of the first recess, and forming a gate on the gate dielectric layer.

In decreasing the depth of the second recess, the isolation layer may be removed by a thickness that is the same as (equal to), or greater than, the second depth to completely (or substantially) remove the second recess from the isolation layer. In decreasing the depth of the second recess, the isolation layer may be removed by a thickness that is less than the second depth to partially remove the second recess from the isolation layer.

The semiconductor substrate in the active region and the isolation layer may be removed together (or simultaneously) to reduce the depth of the second recess. To reduce the depth of the second recess, the semiconductor substrate in the active region and the isolation layer may be polished until the second recess is completely (or substantially) removed from the isolation layer. In decreasing the depth of the second recess, the semiconductor substrate in the active region and the isolation layer may be polished until the inside of the second recess is filled with a protection film.

According to example embodiments, a method of manufacturing a semiconductor device includes forming an isolation layer that defines an active region in a semiconductor substrate, forming a plurality of recesses including a first recess located (or formed) in the active region and a second recess located (or formed) in the isolation layer by etching the semiconductor substrate and the isolation layer, wherein the semiconductor substrate has an etch rate greater than that of the isolation layer, removing the second recess from the isolation layer by simultaneously polishing the isolation layer and the active region, forming a gate dielectric layer on an inner wall of the first recess and forming a gate on the gate dielectric layer.

BRIEF DESCRIPTION OF THE DRAWINGS

Example embodiments will be more clearly understood from the following detailed description taken in conjunction with the accompanying drawings.

FIG. 1 is a diagram illustrating a layout of a plurality of word lines forming a gate of a transistor in a semiconductor device formed by a manufacturing method according to example embodiments;

FIGS. 2A through 2H are diagrams illustrating cross-sectional views of a method of manufacturing a semiconductor device according to example embodiments; and FIGS. 3A through 3C are diagram illustrating cross-sectional views of a method of manufacturing a semiconductor device according to example embodiments.

DETAILED DESCRIPTION OF EXAMPLE EMBODIMENTS

Figure 1:
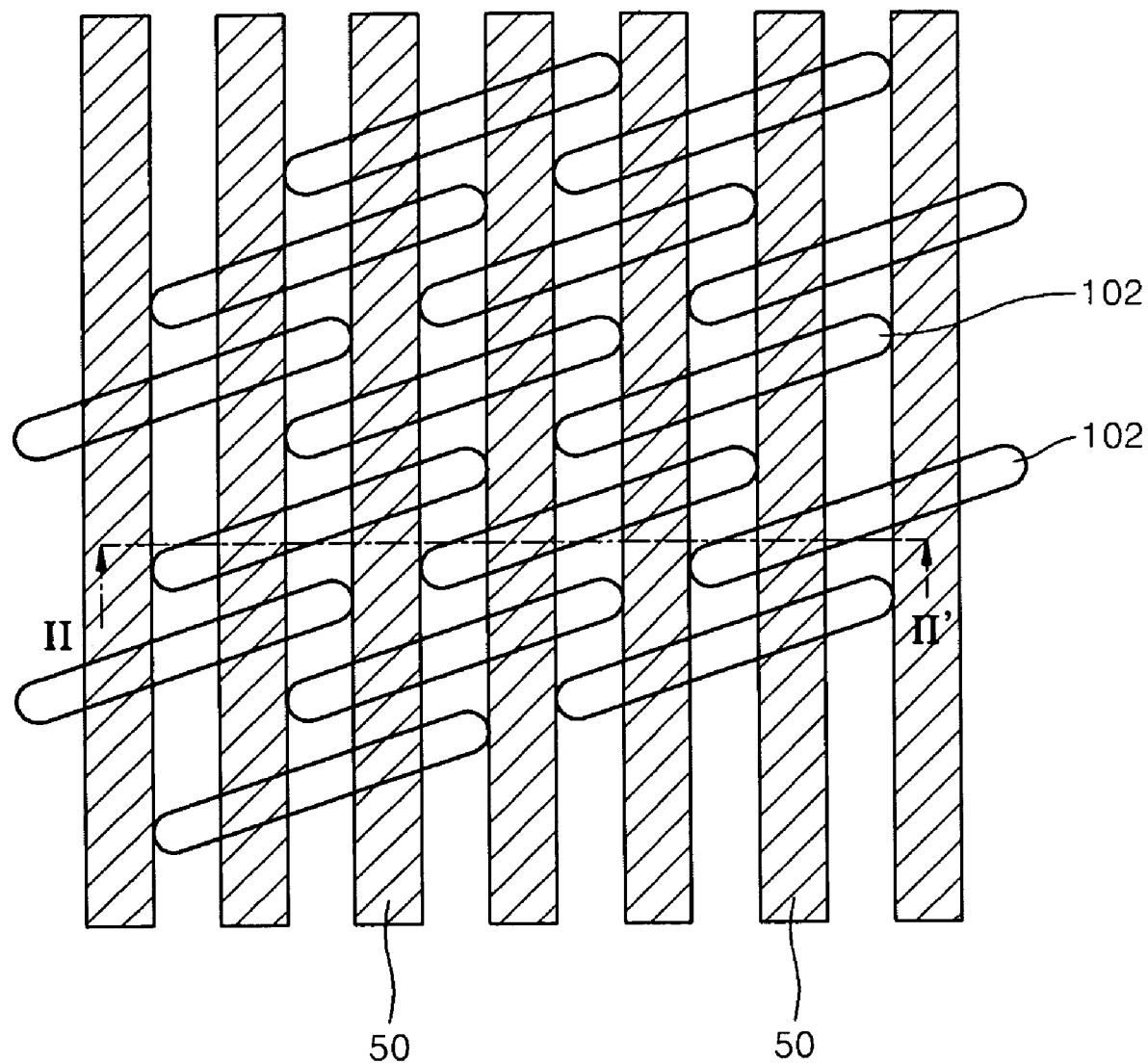
FIGS. 1, 2A-2H and 3A-3C represent non-limiting, example embodiments as described herein.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is, referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to methods of manufacturing a semiconductor device. Other example embodiments relate to methods of manufacturing a semiconductor device having a recess channel array transistor (RCAT).

FIG. 1 is a diagram illustrating a layout view of the plane array of a plurality of word lines 50 forming a gate of a transistor in a semiconductor device formed by a manufacturing method according to example embodiments. In FIG. 1, a layout of some constituent elements forming a cell array region of a DRAM is illustrated.

Referring to FIG. 1, a plurality of active regions 102 each having an island shape is defined by an isolation layer (not shown) in a cell array region of a semiconductor substrate. The word lines 50 extend parallel to one another in a particular (or desired) direction on the active regions 102. A method of manufacturing a semiconductor device according to example embodiments in order to form the word lines 50 according to the layout of FIG. 1 is described below.

FIGS. 2A through 2H are diagrams illustrating cross-sectional views of a method of manufacturing a semiconductor device according to example embodiments. Each of FIGS. 2A through 2H corresponds to a cross-sectional view taken along line II-II' of FIG. 1.

Figure 2A:
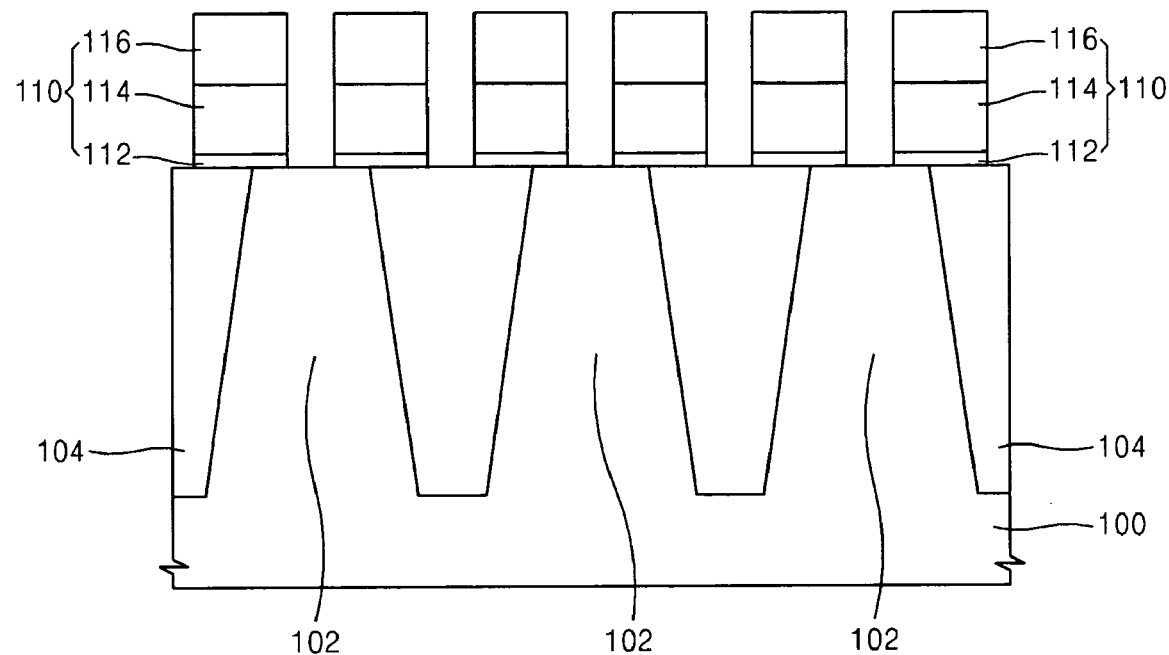

Referring to FIG. 2A, an isolation layer 104 formed of an insulating layer defining the active region 102 having a desired shape may be formed in a semiconductor substrate 100 (e.g., a silicon substrate). A shallow trench isolation (STI) process may be used to form the isolation layer 104. A mask pattern 110 including a pad insulating layer 112, a first mask layer 114 and a second mask layer 116 may be formed on the semiconductor substrate 100. A portion of an upper surface of the active region 102 and a portion of an upper surface of the isolation layer 104 may be exposed through the mask pattern 110.

The pad insulating layer 112 may be formed of a silicon oxide layer. The first mask layer 114 may be formed of a silicon nitride layer or a silicon oxide-nitride layer. The second mask layer 116 may be formed of an amorphous carbon layer (ACL). In other example embodiments, the first mask layer 114 may be formed of a polysilicon layer, and the second mask layer 116 may be formed of a silicon nitride layer, a silicon oxynitride layer or an organic anti-reflective coating layer. The materials used to form each of the pad insulating layer 112, the first mask layer 114 and the second mask layer 116 are not limited to the above-described materials and a variety of modifications may be made as necessary.

Figure 2B:
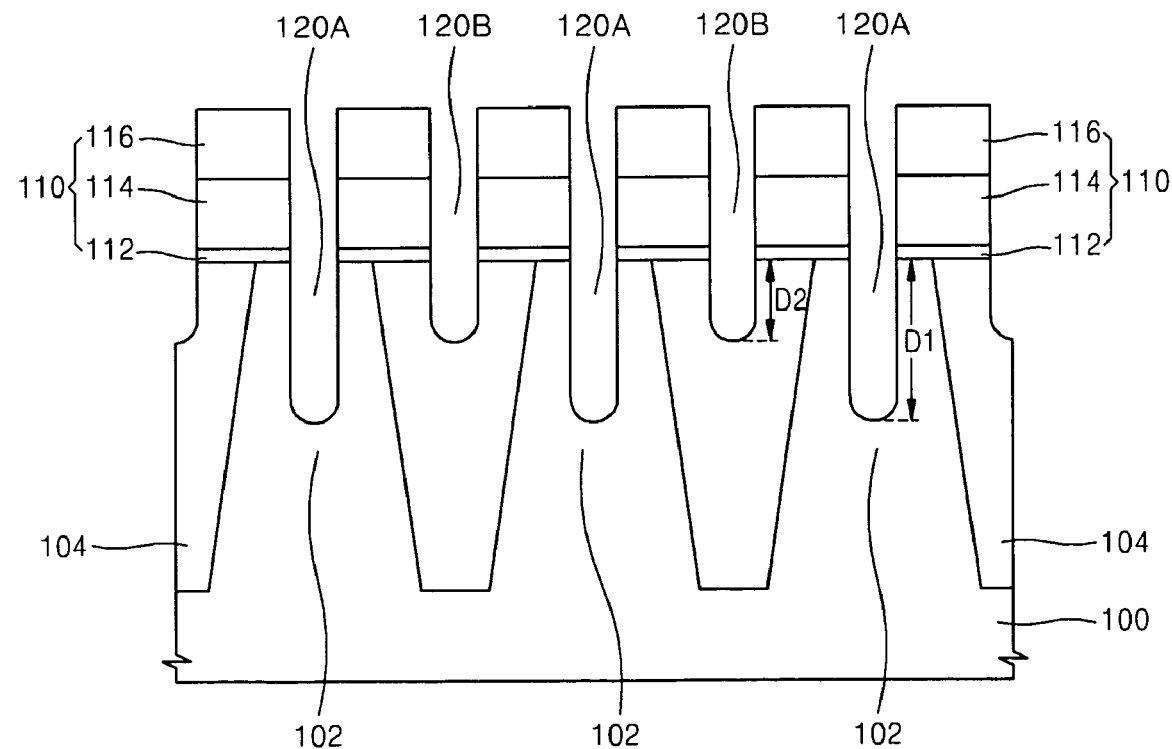

Referring to FIG. 2B, recesses 120A and 120B for forming a gate may be formed by respectively etching the exposed active region 102 and the exposed isolation layer 104 of the semiconductor substrate 100 using the mask pattern 110 as an etch mask. The recesses 120A and 120B may be formed in a line shape so as to be connected to each other in the active region 102 and the isolation layer 104. In FIG. 2B, the recess formed in the active region 102 is indicated as "120A" and the recess formed in the isolation layer 104 is indicated as "120B".

During the etch process for forming the recesses 120A and 120B, the etch process is performed such that the etch rate of the semiconductor substrate 100 forming the active region 102 may be higher than that of the insulating layer forming the isolation layer 104. For example, during the etch process for forming the recesses 120A and 120B, an etch atmosphere may be controlled by setting an etch selectivity of the active region 102 to the isolation layer 104 to be about 5:1 so that the etch rate of the active region 102 is higher than that of the isolation layer 104. As such, the depth D1 of the recess 120A formed in the active region 102 may be greater than the depth D2 of the recess 120B formed in the isolation layer 102 with respect to the upper surface of the semiconductor substrate 100.

In FIG. 2B, the recess 120A formed in the active region 102 my be shaped like an substantially circular column. A recess having a sectional shape different from the shape shown in FIG. 2B may be formed. For example, to form a recess having a different shape in the active region 102, a process of isotropically etching the recess 120A from its bottom to a desired depth in a state in which an inner side wall of the recess 120A formed in the active region 102 is covered with a spacer for an etch mask may be performed. A lower recess having a width larger than that of the recess 120A and connected to the recess 120A in the lower portion of the recess 120A may be formed so that a recess having different widths for the upper and lower portions may be formed in the active region 102.

Figure 2C:
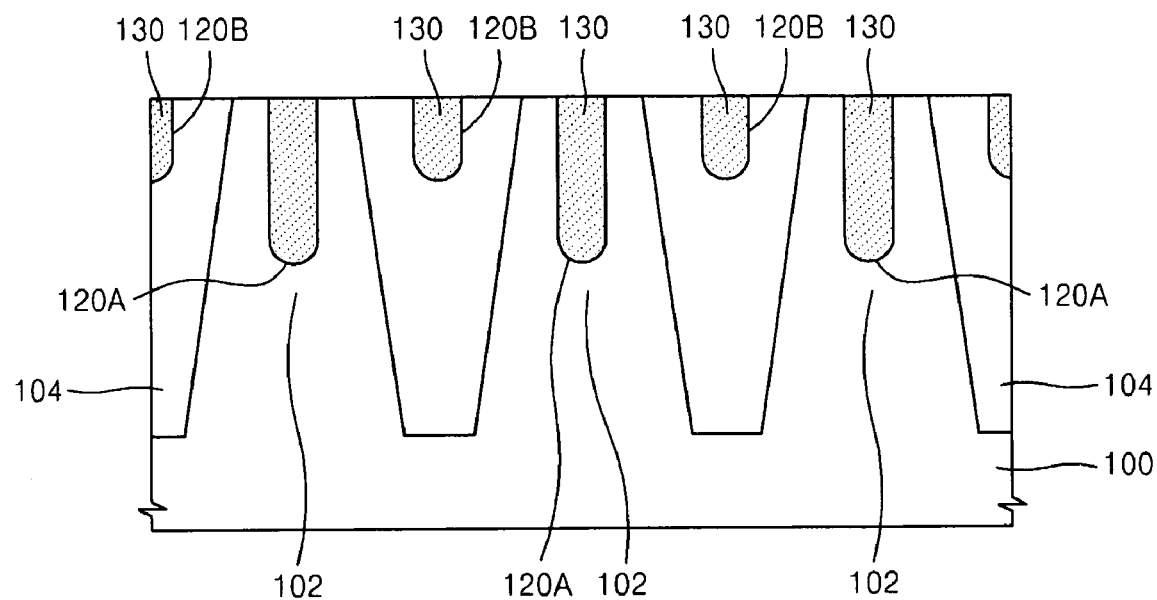

Referring to FIG. 2C, after the mask pattern 110 is removed from a resultant where the recesses 120A and 120B are formed, the recesses 120A and 120B may be filled with a protection film 130. The protection film 130 may prevent (or reduce) contamination or damage to the recess 120A formed in the active region 102. The protection film 130 may be formed of a material that may be selectively removed without damaging the semiconductor substrate 100 and the isolation layer 104. For example, the protection film 130 may be formed of a film including polymer or a polymer-containing film (e.g., a photoresist material), or a carbon-containing layer.

After a material layer for forming the protection film 130 is formed on the semiconductor substrate 100 to completely (or substantially) fill the inside of the recesses 120A and 120B in a coating or deposition process, the material layer for forming the protection film 130 may be partially removed through an etch back, or chemical mechanical polishing (CMP), process until the upper surface of the semiconductor substrate 100 is exposed in order to form the protection film 130. The process of forming the protection film 130 described with reference to FIG. 2C may be omitted.

Figure 2D:
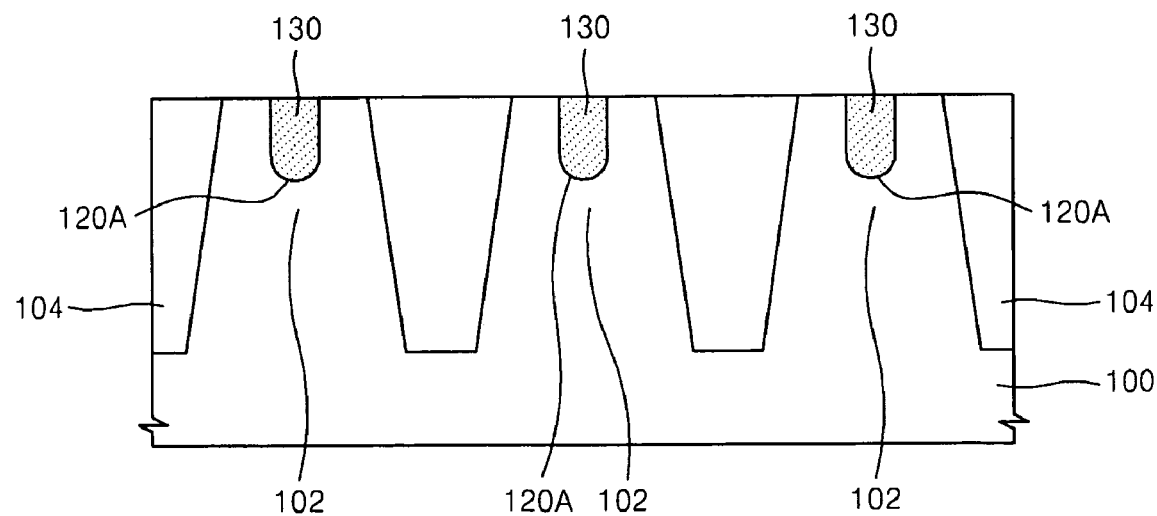

Referring to FIG. 2D, the depth of the recess 120B formed in the isolation layer 104 may be decreased by removing the isolation layer 104 by a desired thickness from the upper portion (or near the entry point) of the recess 120B. The semiconductor substrate 100, the isolation layer 102 and the protection film 130 may be simultaneously planarized through the CMP process so that portions of the semiconductor substrate 100, the isolation layer 102 and the protection film 130 are removed from the upper surfaces thereof by the same thickness.

In FIG. 2D, in order to remove the recess 120B from the isolation layer 104, a portion of the semiconductor substrate 100, the isolation layer 102 and the protection layer 130 may be removed from the upper surfaces thereof by a desired thickness until the protection film 130 formed on the isolation layer 104 is completely (or substantially) removed. However, example embodiments are not limited thereto. Even if a portion of the recess 120B having a depth less than the original depth D2 of the recess 120B remains in the isolation layer 104, noise from a gate formed in the recess 120A of the active region 104 may be reduced compared to a case in which the recess 120B maintains the original depth D2.

If the process for forming the protection film 130 described with reference to FIG. 2C is omitted, a process of decreasing the depth of the recess 120B in the isolation layer 104 may be performed in which the protection film 130 is not present in the recesses 120A and 120B. In this case, after the depth of the recess 120B is decreased, a cleaning process to remove contaminants from inside of the recess 120A and the upper surface of the semiconductor substrate 100 may be performed as necessary.

Figure 2E:
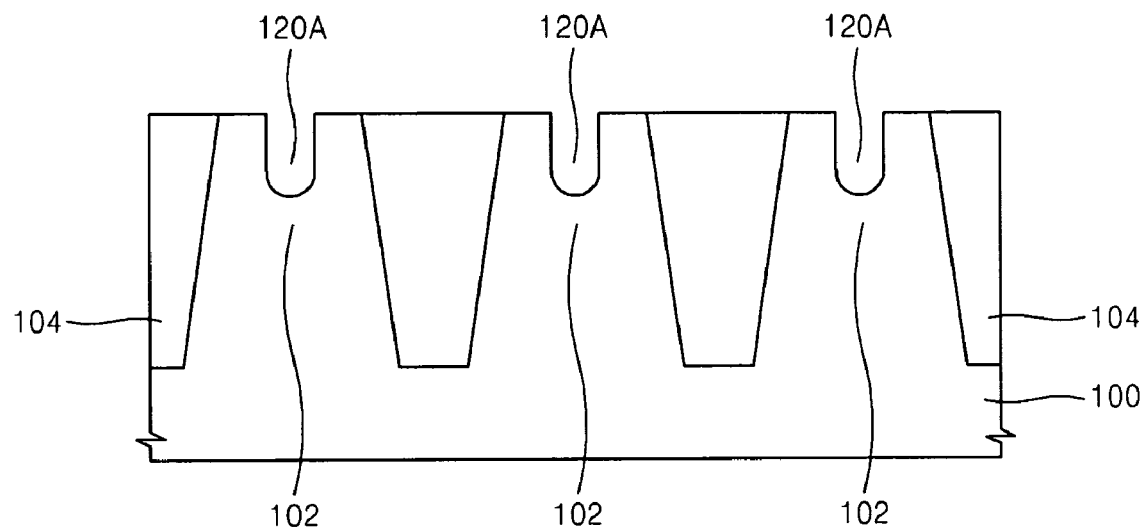

Referring to FIG. 2E, the inner wall of the recess 120A may be exposed outwardly from the active region 102 by removing the protection film 130.

Figure 2F:
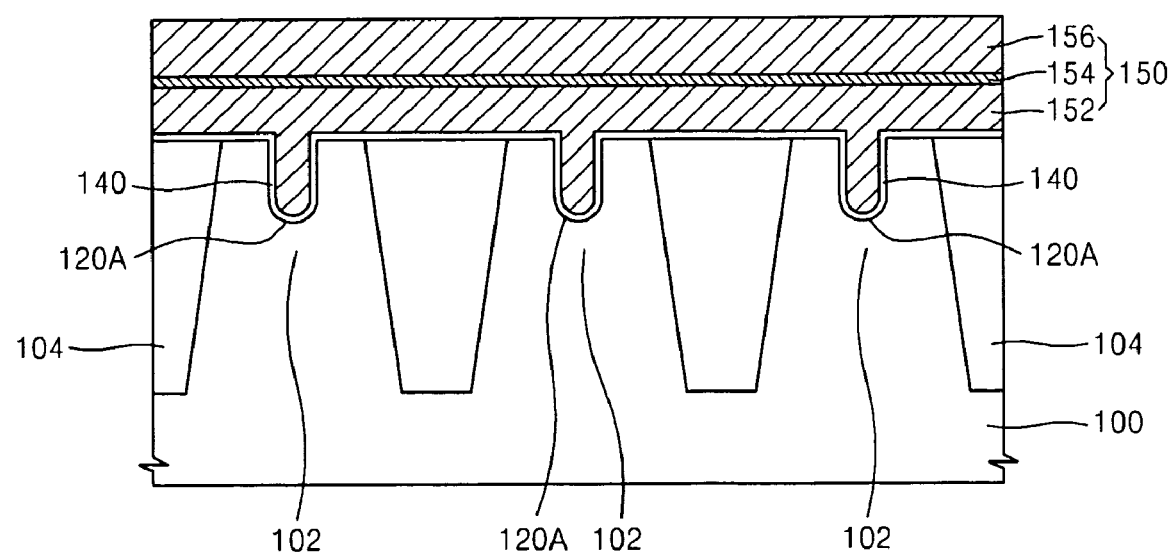

Referring to FIG. 2F, after a gate dielectric layer 140 is formed on the inner wall of the recess 120A, a conductive layer 150 for forming a gate is formed on the gate dielectric layer 140 to completely (or substantially) fill the inside of the recess 120A. The gate dielectric layer 140 may be formed of a silicon oxide film. The conductive layer 150 may be formed in a multilayer structure having a polysilicon layer 152, a barrier layer 154 and a metal layer 156. The metal layer 156 may be formed of tungsten. The barrier layer 154 may have a structure in which a first metal silicide film, a TiN film and a second metal silicide film (all not shown) are sequentially deposited. Each of the first metal silicide film and the second metal silicide film may be formed of a tungsten silicide film.

Figure 2G:
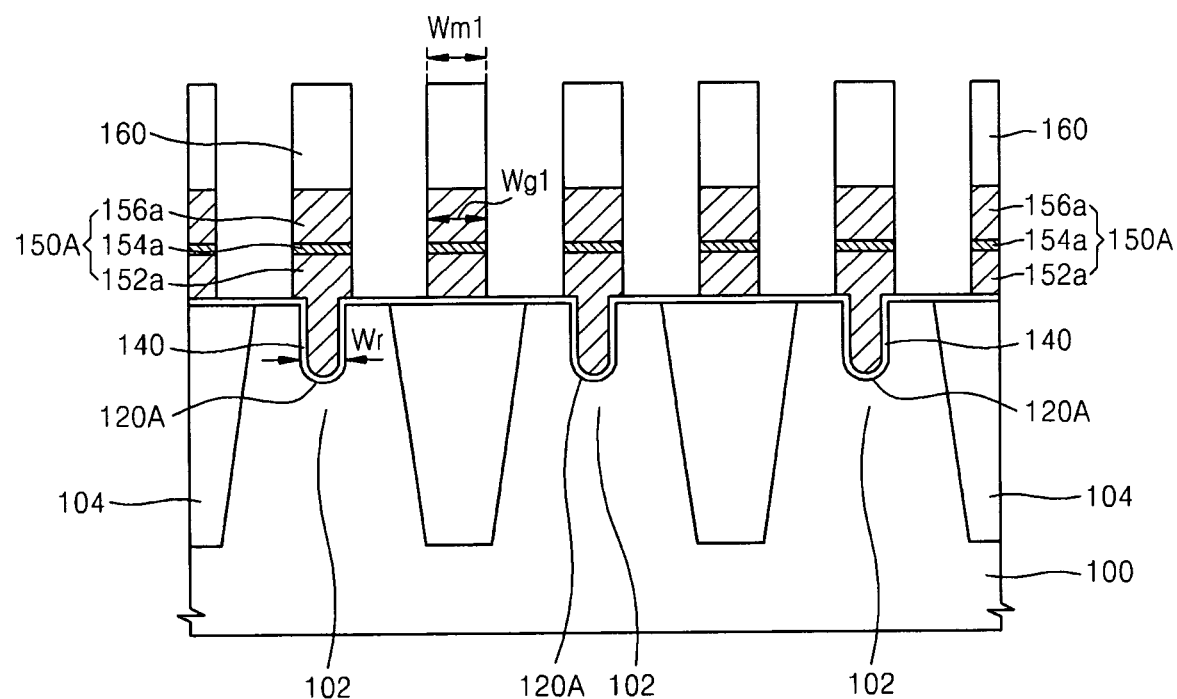

Referring to FIG. 2G, a mask pattern 160 may be formed on the conductive layer 150. The conductive layer 150 may be etched using the mask pattern 160 as an etch mask. A plurality of gates 150A may be formed on the gate dielectric layer 140 formed on the inner wall of the recess 120A of the active region 102.

The mask pattern 160 may be formed of a silicon nitride film. In the structure shown in FIG. 2G, each of the gates 150A formed on the semiconductor substrate 100 has a multilayer structure of a polysilicon pattern 152a, a barrier layer pattern 154a and a metal layer pattern 156a, which may be sequentially deposited on the gate dielectric layer 140. The gates 150A constitute a plurality of the word lines shown in the layout of FIG. 1. The gates 150A extend to simultaneously cover the inside of the recess 120A and the upper surface of the isolation layer 104.

In the structure of FIG. 2G, the width $W_{m1}$ of the mask pattern 160 is the same as, or greater than, the width $W_r$ of the recess 120A. As such, the width $W_{g1}$ of each of the gates 150A is the same as (equal to), or greater, than the width $W_r$ of the recess 120A.

Figure 2H:
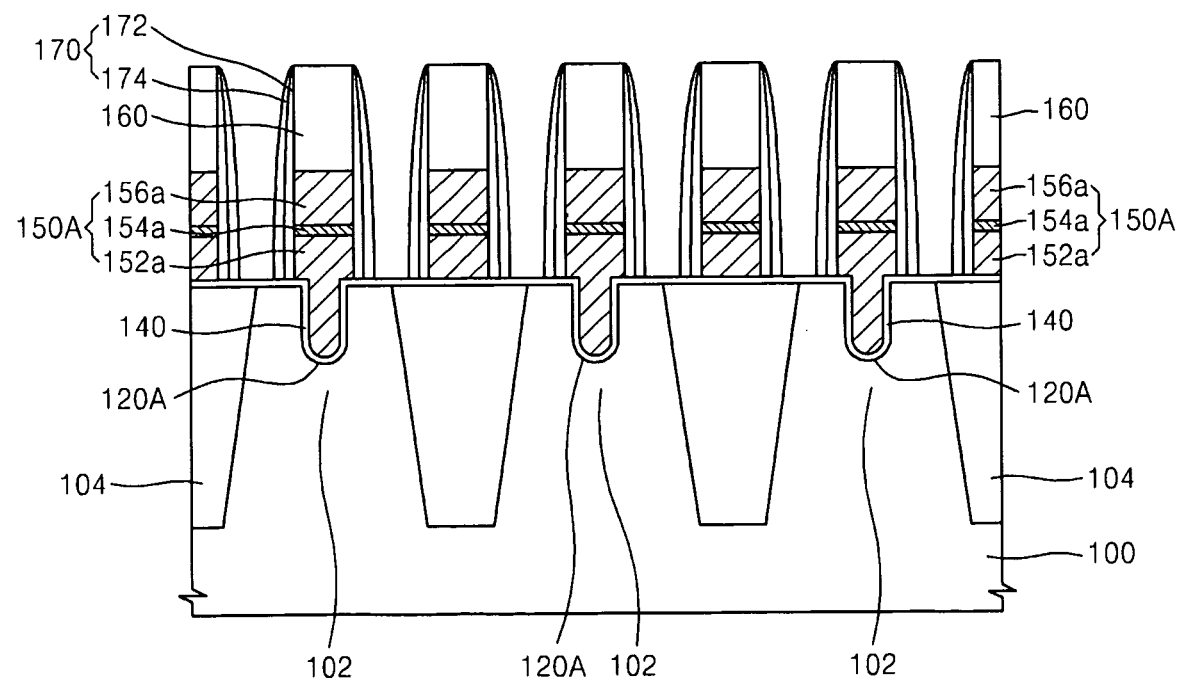

Referring to FIG. 2H, an insulating spacer 170 may be formed on a side wall of each of the gates 150A and the mask pattern 160. The insulating spacer 170 may include an oxide film spacer 172 and a nitride film spacer 174.

In the method of manufacturing a semiconductor device according to example embodiments described with reference to FIGS. 2A through 2H, after the recess 120A is formed in the active region 102, the recess 120B (that is formed in the isolation layer 104 at the same time if the recess 120A is formed) may be removed so that no gate constituting the word lines 50 of FIG. 1 exists around the recess 120A formed in the active region 102 in the isolation layer 104. As such, noise affecting a transistor of a unit cell formed in the active region 102 may be prevented (or reduced) so that the refresh characteristic may increase in the transistor of a unit cell formed in the active region 102.

As described with reference to FIG. 2D, to remove the recess 120B from the isolation layer 104, the isolation layer 104 and the active region 102 may be removed by a desired thickness from the upper surfaces thereof using a planarization process. If the isolation layer 104 is formed in the STI process, as a feature size decreases in a more highly integrated semiconductor device, the isolation layer 104 may be formed having a width that decreases as the depth of the isolation layer 104 increases. In the structure obtained after removing the recess 120B from the isolation layer 104 (as described with reference to FIG. 2D), the area of the active region 102 on the upper surface of the semiconductor substrate 100 is larger than that of the active region 102 before the removal of the recess 120B.

Figure 3A:
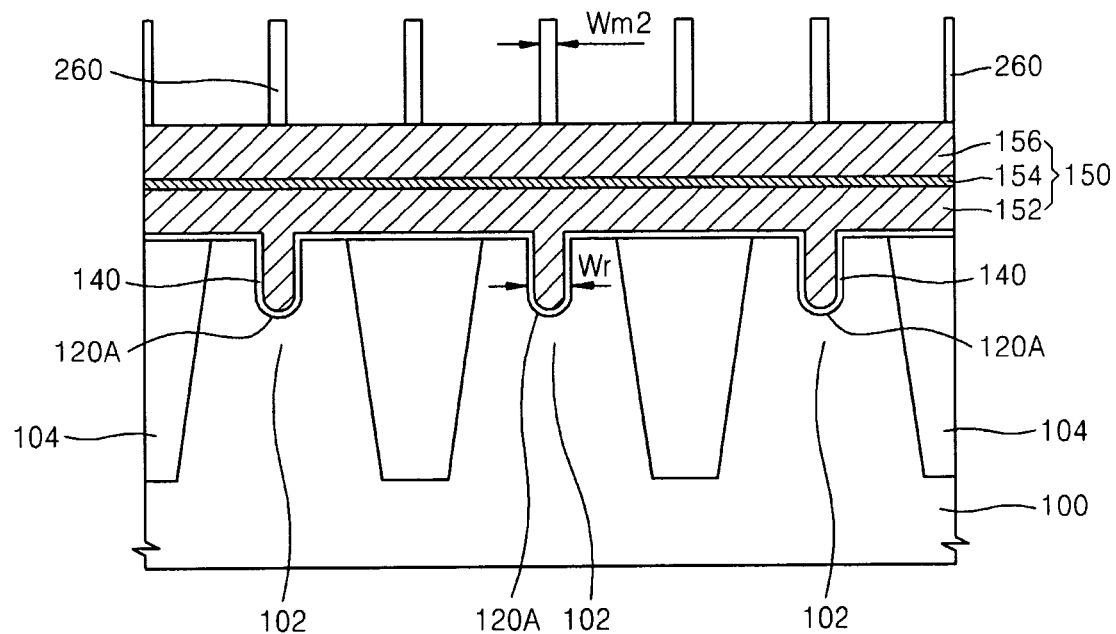
Figure 3B:
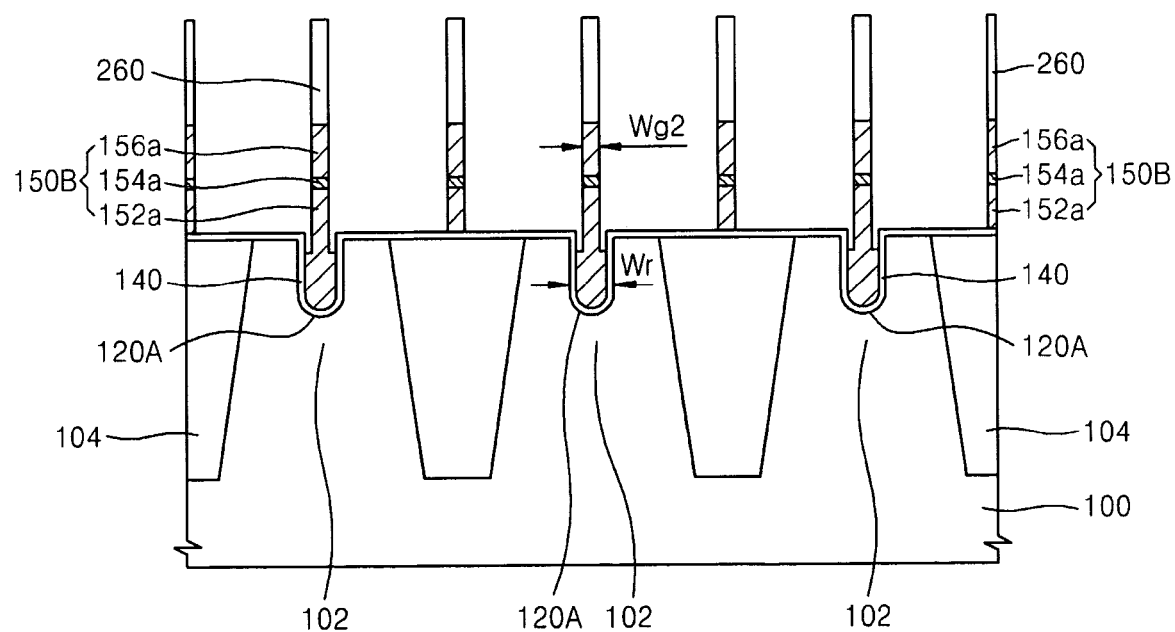
Figure 3C:
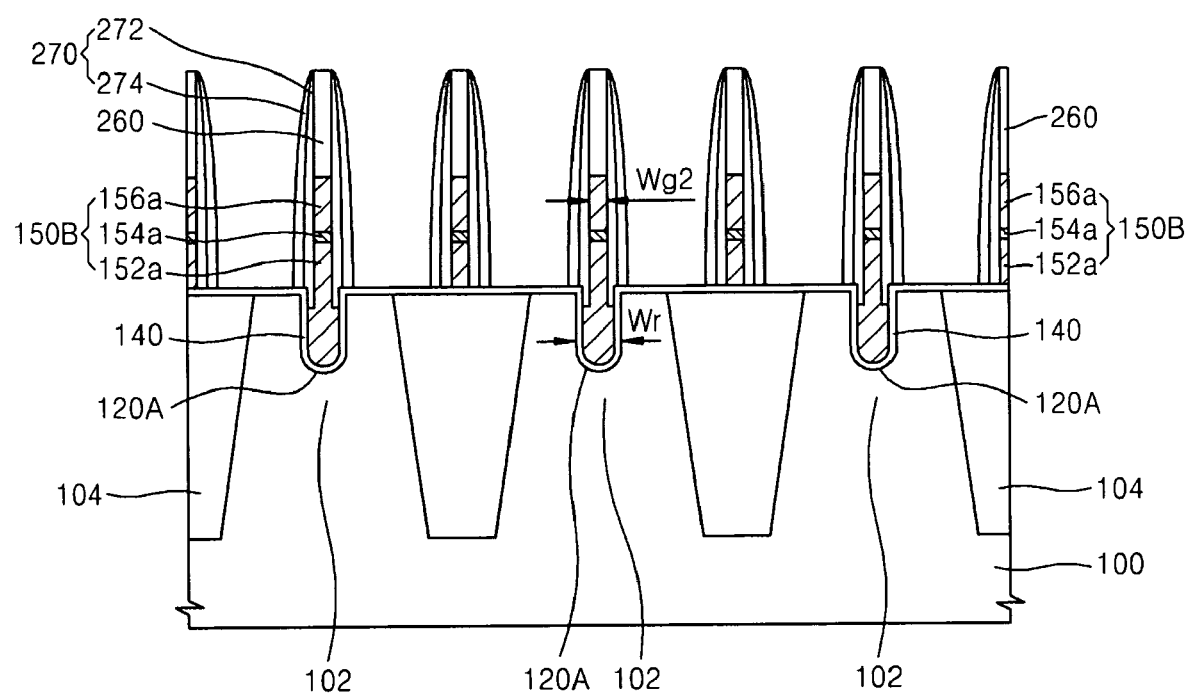

FIGS. 3A through 3C are diagrams illustrating cross-sectional views of a method of manufacturing a semiconductor device according to example embodiments. Each of FIGS. 3A through 3C is a cross-sectional view of a portion corresponding to a section taken along line II-II' of FIG. 1.

Example embodiments described with reference to FIGS. 3A-3C are similar to those described with reference to FIGS. 2A-2G, except that a gate having a width smaller than the width $W_r$ of the recess 120A formed in the active region 102 is formed. In FIGS. 3A through 3C, the same reference numerals as those in the above-described embodiment indicate like elements.

Referring to FIG. 3A, the gate dielectric layer 140 may be formed on the inner wall of the recess 120A located in the active region 102 through a series of the processes described with reference to FIGS. 2A through 2F. The conductive layer 150 for forming a gate may be formed on the gate dielectric layer 140. A mask pattern 260 may be formed on the conductive layer 150.

The mask pattern 260 has substantially the same structure as the mask pattern 160 described with reference to FIG. 2G. However, the mask pattern 260 may have a width $W_{m2}$ smaller than the width $W_r$ of the recess 120A.

Referring to FIG. 3B, a gate 150B may be formed on the gate dielectric layer 140 formed on the inner wall of the recess 120A of the active region 102. The gate dielectric layer 140 may be formed by etching the conductive layer 150 using the mask pattern 260 as an etch mask in a method described with reference to FIG. 2G. During the etching of the conductive layer 150, etching time is controlled such that the polysilicon layer 152a is etched in the recess 120A to a depth shallower than the depth of the recess 120A. As such, the width $W_{g2}$ of the gate 150B formed on the gate dielectric layer 140 is smaller than the width $W_r$ of the recess 120A.

Referring to FIG. 3C, an insulating spacer 270 may be formed on the side walls of the gate 150B and the mask pattern 260 in a method as described above with reference to FIG. 2H. The insulating spacer 270 may include an oxide spacer 272 and a nitride film spacer 274 as shown in FIG. 3C.

In the above-described example embodiments, a process of forming an RCAT according to the layout of FIG. 1 is described. The detailed shape and array of the active region 102 and the word lines 50 shown in the layout of FIG. 1 are merely exemplary. The shape and array of the active region 102 and the word lines 50 may be modified. For example, the method according to example embodiments may be used to the manufacture a variety of semiconductor devices (e.g., DRAMs, SRAMs, flash memories and the like).

According to example embodiments, after a recess for forming an RCAT is formed in an active region of a semiconductor substrate, a recess that is unnecessarily formed on an isolation layer may be removed before a gate is formed. As such, a gate that constitutes a word line is not formed in the isolation layer around the recess formed in the active region. As such, the noise that affects a transistor of a unit cell formed in the active region is removed (or reduced), increasing refresh characteristics of the transistor in a unit cell formed in the active region.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of manufacturing a semiconductor device, comprising:
   defining an active region by forming an isolation layer in a semiconductor substrate;
   forming a plurality of recesses including a first recess formed in the active region to a first depth and a second recess formed in the isolation layer to a second depth that is less than the first depth;
   decreasing the second depth of the second recess by simultaneously polishing the isolation layer and the semiconductor substrate in the active region until the second recess is removed from an upper surface of the isolation layer;
   forming a gate dielectric layer on an inner wall of the first recess; and
   forming a gate on the gate dielectric layer.

2. The method of claim 1, wherein, decreasing the second depth of the second recess includes removing the isolation layer by a thickness equal to, or greater than, the second depth such that the second recess is substantially removed from the isolation layer.

3. The method of claim 1, wherein, decreasing the second depth of the second recess includes removing the isolation layer by a thickness that is less than the second depth such that the second recess is partially removed from the isolation layer.

4. The method of claim 1, wherein simultaneously polishing the semiconductor substrate in the active region and the isolation layer includes using a chemical mechanical polishing process.

5. The method of claim 1, wherein decreasing the second depth of the second recess includes polishing the semiconductor substrate in the active region and the isolation layer until an inside of the second recess is filled with a protection film.

6. The method of claim 5, wherein the protection film is formed of a polymer-containing film or a carbon-containing film.

7. The method of claim 1, wherein a width of the gate is equal to, or greater than, a width of the first recess.

8. The method of claim 1, wherein a width of the gate is less than a width of the first recess.

9. The method of claim 1, wherein the gate simultaneously covers an inside of the first recess and the upper surface of the isolation film.

10. The method of claim 1, wherein an upper surface of the gate is higher than a height of an upper surface of the semiconductor substrate.

11. A method of manufacturing a semiconductor device, comprising:
    forming an isolation layer that defines an active region in a semiconductor substrate;
    forming a plurality of recesses including a first recess formed in the active region and a second recess formed in the isolation layer by etching the semiconductor substrate and the isolation layer under an etching condition, the semiconductor substrate having an etch rate greater than the isolation layer;
    removing the second recess from the isolation layer by simultaneously polishing the isolation layer and the semiconductor substrate in the active region;
    forming a gate dielectric layer on an inner wall of the first recess; and
    forming a gate on the gate dielectric layer.

12. The method of claim 11, wherein removing the second recess includes:
    filling a protection film in the first recess and the second recess; and
    simultaneously polishing the isolation layer, the active region and the protection film until the protection film in the second recess is substantially removed.

13. The method of claim 12, wherein the protection film is formed of a polymer-containing film or a carbon-containing film.

14. The method of claim 11, wherein a width of the gate equal to, or greater than, a width of the first recess.

15. The method of claim 11, wherein a width of the gate is less than a width of the first recess.

16. The method of claim 11, wherein the gate simultaneously covers an inside of the first recess and an upper surface of the isolation film.

17. The method of claim 11, wherein an upper surface of the gate is higher than an upper surface of the semiconductor substrate.

18. The method of claim 11, wherein forming the gate includes sequentially depositing a first conductive layer filling an inside of the first recess, and a second conductive layer formed of a material different from that of the first conductive layer.

19. The method of claim 1, further comprising entirely filling the first recess and the second recess with a protection film, prior to decreasing the second depth of the second recess, wherein the first recess remains entirely filled with the protection film after the second recess is removed.

20. The method of claim 19, further comprising completely removing the protection film from the first recess after the second recess is removed.

21. A method of manufacturing a semiconductor device, comprising:
    defining an active region by forming an isolation layer in a semiconductor substrate;
    forming a plurality of recesses including a first recess formed in the semiconductor substrate in the active region to a first depth and a second recess formed in the isolation layer to a second depth that is less than the first depth;
    decreasing the second depth of the second recess by simultaneously polishing the isolation layer and the semiconductor substrate in the active region until the second recess is removed from an upper surface of the isolation layer, such that the first recess is reduced to a gate trench;
    forming a gate dielectric layer on an inner wall of the gate trench; and
    forming a gate on the gate dielectric layer,
    wherein the first depth is more than a depth of the gate trench.

* * * * *